United States Patent
Lowrey et al.

(10) Patent No.: US 7,426,135 B2
(45) Date of Patent: Sep. 16, 2008

(54) STATIC RANDOM ACCESS MEMORY CELL USING CHALCOGENIDE

(75) Inventors: Tyler A Lowrey, West Augusta, VA (US); Ward D. Parkinson, Boise, ID (US)

(73) Assignee: Ovonyx, Inc., Rochester Hills, MI (US)

(*) Notice: Subject to any disclaimer, the term of this patent is extended or adjusted under 35 U.S.C. 154(b) by 149 days.

(21) Appl. No.: 11/158,619

(22) Filed: Jun. 22, 2005

(65) Prior Publication Data

US 2006/0291272 A1 Dec. 28, 2006

(51) Int. Cl.
*G11C 11/00* (2006.01)
(52) U.S. Cl. .................. 365/163; 365/148; 365/113
(58) Field of Classification Search .............. 365/148, 365/163, 189.01, 113, 63; 257/2–4
See application file for complete search history.

(56) References Cited

U.S. PATENT DOCUMENTS

| | | | | |
|---|---|---|---|---|
| 5,790,452 A * | 8/1998 | Lien | ............................ | 365/154 |
| 6,108,233 A * | 8/2000 | Lee et al. | ..................... | 365/154 |
| 6,847,543 B2 * | 1/2005 | Toyoda et al. | ................ | 365/154 |
| 7,038,938 B2 * | 5/2006 | Kang | .......................... | 365/154 |
| 7,082,051 B2 * | 7/2006 | Ha et al. | ...................... | 365/163 |
| 7,092,277 B2 * | 8/2006 | Bedeschi et al. | ............ | 365/148 |
| 7,099,180 B1 * | 8/2006 | Dodge et al. | ................ | 365/148 |
| 7,259,982 B2 * | 8/2007 | Johnson | ....................... | 365/163 |

* cited by examiner

*Primary Examiner*—David Lam
(74) *Attorney, Agent, or Firm*—Trop, Pruner & Hu, P.C.

(57) ABSTRACT

A static random access memory may be formed using a bitline and a bitline bar coupled to ovonic threshold switches. The ovonic threshold switches may, in turn, be coupled to cross coupled NMOS transistors. In some embodiments, a very compact static random access memory may result.

18 Claims, 6 Drawing Sheets

STATIC RANDOM ACCESS MEMORY CELL USING CHALCOGENIDE

BACKGROUND

This invention relates generally to semiconductor memories.

One type of volatile semiconductor memory is a static random access memory. In the static random access memory, one of two states may be preserved without the need for refreshing. Static random access memories (SRAM) are highly useful in low power consumption applications, particularly where speed is desirable. Thus, they have found widespread use in battery powered applications.

Of course, the cost of the static random access memory is a function of the size of its cells. Conventional cells may use four or more transistors, as well as additional devices such as resistors.

Thus, if the size of the static random access memory could be reduced, the cost of these devices could also be reduced.

BRIEF DESCRIPTION OF THE DRAWINGS

FIG. 1A is a schematic depiction of a cell in accordance with another embodiment of the present invention.

DETAILED DESCRIPTION

Figure 1:
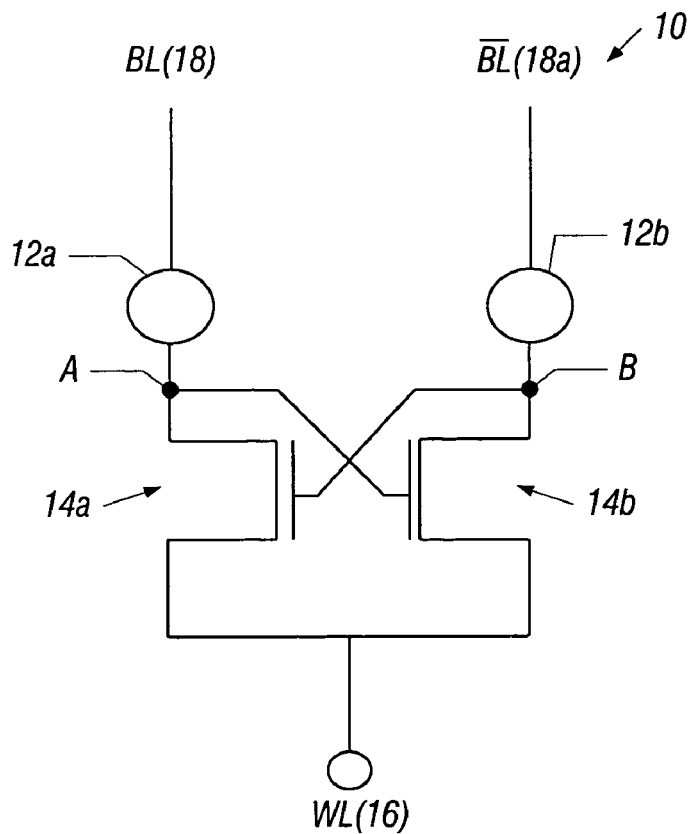
FIGS. 1, 1A is a schematic depiction of a cell in accordance with one embodiment of the present invention.

Referring to FIG. 1, a static random access memory (SRAM) cell 10 embodiment includes a bitline 18 and an inverse bitline or bitline bar 18a. Connected to each of the bitlines 18 and 18a is an ovonic threshold switch 12a or 12b. A pair of cross coupled NMOS transistors 14a and 14b have their gates coupled to one electrode of an ovonic threshold switch (OTS) 12a or 12b. The drains of each transistor 14a and 14b are also coupled to the switches 12a and 12b. The source of each transistor 14a or 14b is coupled to a word line 16. Thus, in some embodiments, a two transistor or 2T embodiment may be utilized. However, in other embodiments, other arrangements may be utilized as well.

Figure 2:
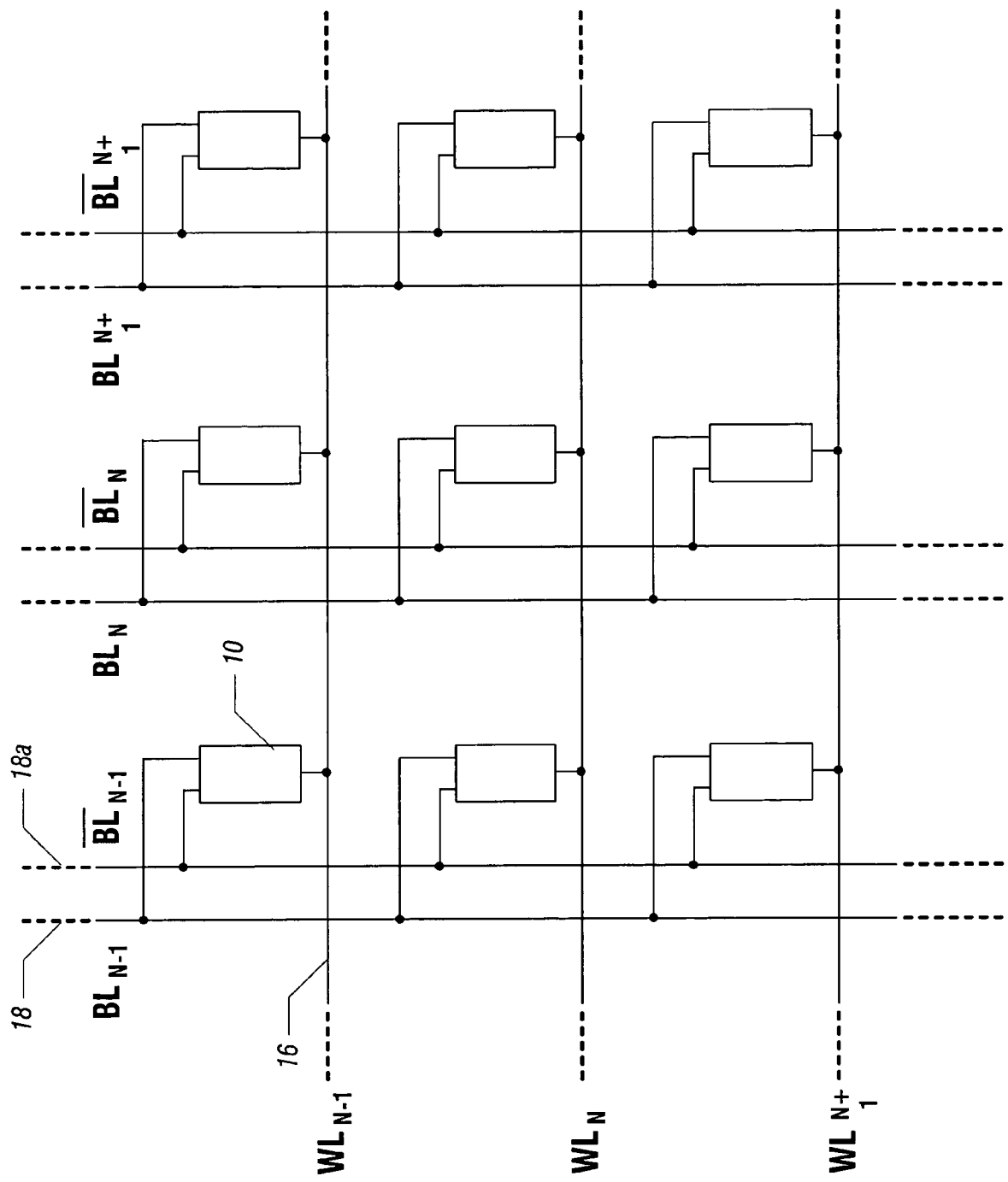
FIG. 2 is a schematic depiction of an array layout in accordance with one embodiment of the present invention.

Thus, referring to FIG. 2, an array may be composed of cells 10, each coupled to a pair of bitlines, including a bitline 18 and the bitline bar 18b. Each cell 10 is also coupled to a word line 16. Thus, the cells 10 may be arranged in rows constituted by the word lines and columns constituted by a pair of bitlines in some embodiments.

Figure 3:
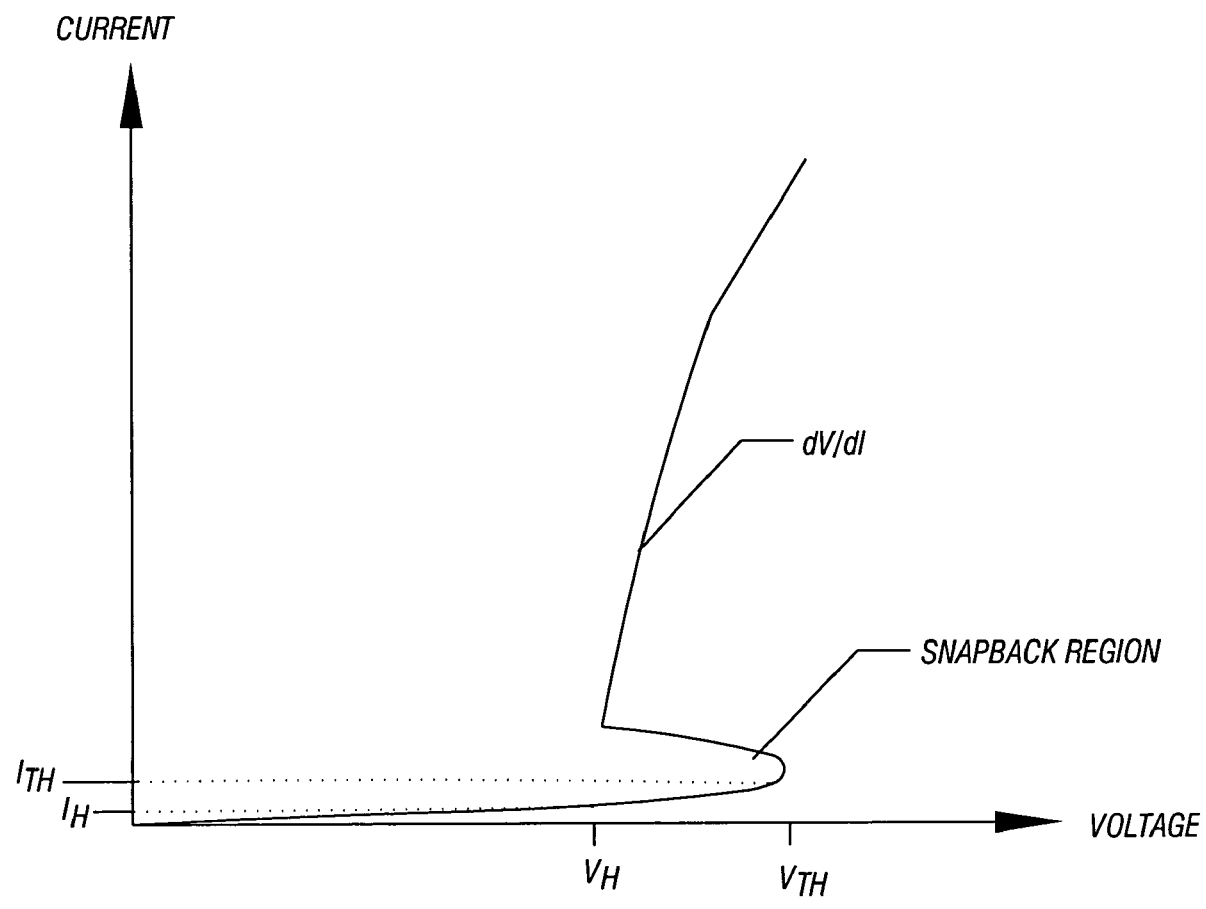
FIG. 3 is a plot of current versus voltage for an ovonic threshold switch in accordance with one embodiment of the present invention.

Referring to FIG. 3, the operation of an ovonic threshold switch 12 is illustrated. In a low voltage or low field regime "L," the switch 12 is off and may exhibit very high resistance in some embodiments. The off resistance can, for example, range from preferably greater than 50,000 ohms to be greater than 10 gigaohms at a bias of about half the threshold voltage. The switch 12 may remain in its off state until a voltage across it exceeds a threshold voltage ($V_{TH}$) or until a current exceeding a threshold current ($I_{TH}$) switches the device 12 to a highly conductive, low or dynamic resistance "on" state called dV/dI region that, when extrapolated, will intercept the X axis at the holding voltage $V_H$.

After turn-on, the voltage across the device 12 drops to a lower voltage, near the holding voltage $V_H$, and remains very close to this holding voltage almost regardless of the current flowing through the ovonic threshold switch since the dynamic on resistance is relatively low, frequently less than 1000 ohms (in series with the device 12 holding voltage).

After passing through the snapback region, in the on state, the device 12 voltage drop remains close to the holding voltage as the current passing through the device is increased, even if at a relatively high, read or write current level. Above a relatively high current level (density) the device remains on but displays a finite and increasing dynamic resistance, with the voltage drop across 12a increasing with increasing current due to the IR drop across the dynamic resistance.

The device 12 may remain on until the current through the device 12 is reduced below a characteristic holding current value that is dependent on the type and area of the material, and may be impacted by the top and bottom electrodes utilized to form the device 12, as well as the magnitude of capacitance on the column line.

In some embodiments of the present invention, the device 12 does not change phase. It remains permanently amorphous and its current-voltage characteristics may remain the same throughout its operating life.

As an example, for a 0.5 micrometer diameter device 12, with a thickness of approximately 750 Angstroms, formed of TeAsGeSSe having respective atomic percents of 16/13/15/1/55, the holding current may be on the order of 0.1 to 1 micro-amps (uA) in one embodiment. Below this holding current, the device 12 turns off and returns to the high resistance regime at low voltage, low field in FIG. 3.

The threshold current for the device 12 may generally be of the same order as the holding current, or preferably greater to avoid oscillation if driven by a high impedance current source. The holding current may be altered by changing process variables, such as the top and bottom electrode material and the chalcogenide material. The device 12 may provide high "on current" for a given area of device compared to conventional access devices such as metal oxide semiconductor field effect transistors or bipolar junction transistors or semiconductor diodes.

In accordance with one embodiment of the present invention, a voltage V may be chosen as the maximum operating voltage for the memory array. In one embodiment, it may be 3 volts. The OTS devices 12 may be provided with a threshold voltage, $V_{TH}$, between 2V/3 and V in some embodiments. The holding voltage $V_H$ of the OTS devices 12 may be between V/3 and 2V/3 in some embodiments. All unselected word lines may be biased to V/3 in some embodiments. All unselected bitlines and bitline bars may be biased to 2V/3 in some embodiments. Then, selected word lines 16 may be biased at a voltage less than the unselected word line voltage.

For reading, the selected bitlines and bitline bars may be ramped from 2V/3 towards V using a current source or, as another example, they may be pre-charged at V, and then one of the bitlines may be discharged when current is forced through a selected cell's word line, such as when the word line is selected by lowering it.

For writing, the selected cell's word line may be biased at 0 volts for one embodiment. To write a 1, the selected bitline 18 is biased at V, while the selected bitline bar 18a is kept at 2V/3. To write a 0, the selected bitline bar 18a is biased at V, while the selected bitline 18 is kept at 2V/3.

The cross coupled NMOS transistors 14 may have threshold voltages less than V/3. The threshold voltage of the transistors 14 may be higher to assure that the sub-threshold current into the drain of the off transistor is substantially less than the positive pull-up current from the OTS device 12 on the drain of the off transistor over the specified temperature range. That is, the leakage current of an OTS device 12 with less than 0.1 volts across the OTS 12 may be more than the leakage of the off transistor 14. The substrate may be biased or pumped negative relative to the most negative voltage imposed on the word line 16 to avoid unreasonably high body effect that can lower the threshold voltage when the word line is low and cause excessive sub-threshold transistor leakage in off transistors, in some embodiments.

In the following discussion, a detailed embodiment of a write and read operation is provided. However, the present invention is not limited to any particular read or write operation, and these examples are given without limiting the scope of present invention.

In such an embodiment, all of the word lines 16 may initially be biased to V/3. Then, the bitlines 18 and bit line bars 18a are biased to 2V/3. If the cell was previously in the 0 state, the NMOS transistor 14a remains on and the node A follows, being pulled down to 0 volts from source to drain, so both source and drain are at about V/3. With the NMOS transistor 12a on, there is a high capacitive coupling between the gate of the NMOS transistor 12a, its drain, channel, and source. Thus, the node B is coupled down from 2V/3 towards V/3 if the word line 16 is lowered to 0 volts, such as during a write cycle.

To write a 1, the bitline 18 is brought to V, while the bitline bar 18a remains at 2V/3. The OTS 12a now has V volts applied across it. This voltage is greater than its threshold voltage, turning on the device by going to a low resistance in series with the holding voltage, which may be between V/3 and 2V/3. The OTS 12b has close to V/3 applied across it and remains off while 12a turns on, since the threshold voltage of the device 12b is also greater than V/3. The OTS 12a is on and has a very low on resistance relative to the source/drain resistance of the on transistor 12a.

Thus, the cross coupled latch, formed of the transistors 14, switches states by turning on NMOS transistor 12b with a low source impedance gate voltage and this turns off NMOS transistor 12a, due to node B being pulled down to 0 volts when transistor 12b turns on, as its gate voltage is raised by the OTS 12a.

Node A is then driven to V minus the holding voltage of the OTS 12 which is greater than V/3 because the holding voltage of the OTS 12 is less than 2V/3 and the word line 16 is still at 0 volts.

Next, the bitline 18 is reduced from V to 2V/3. With the NMOS transistor 14b now on, there is high capacitive coupling between the gate of the NMOS transistor 14b and its drain, channel, and source. Thus, when the bitline 18 is lowered from V to 2V/3, node A starts at 2V/3 or less (if $V_H$ is greater than V/3). However, node A declines only slightly since the OTS device 12a turns off promptly as the selected bitline at V is lowered, and node A remains at a value greater than V/3 and less than V minus the holding voltage of the OTS device 12, since the node A started at V minus the holding voltage of the OTS and the capacitance on node A reduces the voltage across the OTS device as the bitline is lowered (instead of lowering node A as the bitline is lowered.

A capacitive divider action after an OTS device turns off lowers node A from V minus the holding voltage of the OTS device 12a as the bitline 18 voltage lowers. The capacitance across the OTS device 12a may, preferably, be much less than the transistor and parasitic capacitance on node A. The holding voltage of the OTS may, preferably, be adjusted to be enough less than 2V/3 to accommodate the capacitive coupling down of node A from lowering the bitline 18 to 2V/3 so that node A remains more than V/3 greater than the word line 16 potential after bitline 18 returns to 2V/3, upon deselection after write. If node A remains more than V/3 greater than the word line 16 potential and $V_{TH}$ (transistors 14) are less than V/3, then transistor 14b is assured to remain on.

Because node A is pulled up to and starts at V minus the holding voltage of the OTS during the write cycle, the voltage across the OTS device 12a falls below its holding voltage and turns off when the bitline is lowered from V to 2V/3 since the voltage across the OTS device 12a is reduced from its holding voltage by V/3, since node A remains relatively constant as the bitline 18 is lowered (due to capacitance mostly from node A through "on" transistor 14b).

Lowering the bitline to 2V/3 leaves the node A at more than 2V/3 minus the holding voltage of the OTS, because of the capacitive coupling of the node A to the bitline Preferably, node A is not less than V/3, by assuring that the holding voltage of the OTS is adequately less than 2V/3 to accommodate capacitive coupling. Similarly, the holding voltage of the OTS may be less than 2V/3 so that when the word line voltage rises, the voltage from the word line 16 to node A stays greater than V/3. Here, the capacitive coupling as the word line is deselected back to V/3 reduces margin (voltage between node A and the word line that keeps transistor 14b on). Accordingly, the capacitive ratio, $V_H$, and $V_{TH}$ are preferably adjusted so that transistor 14b remains on when the word line is deselected, such as to V/3. Even if transistor 14b turns off, node B is lower than node A, so node A rises enough to turn transistor 14b back on before node B rises to turn transistor 14a on (after deselection).

After the word line 16 is brought back up to V/3, because of the NMOS transistor 14b, there is high capacitive coupling between the gate of the NMOS transistor 14b and its drain, channel and source. Thus, node A couples up to a value preferably greater than 2V/3 and less than V. V and the holding voltage of the OTS are adjusted for parasitic capacitance ratio to prevent the voltage between node A and the word line 16 from being less than a threshold voltage plus an on voltage, where the on voltage is adequate to maintain the cell state during word line switching from V/3 towards 0 during reading. If transistor 14b remains on when the word line 16 returns to V/3, node B is also brought up to V/3, following and remaining about equal to the word line potential at V/3 because transistor 14b remains on during the transitions of the word line during standby and read. Should margin decay and transistor 14b turn off as word line 16 is deselected, the node B may temporarily remain less than V/3 and gradually be charged up to V/3 by OTS device 12b (or pulled up once transistor 14b turns after node A is charged up by device 12a to be above word line 16 plus the threshold voltage of transistor 14b.

To write a 0 into node A where the cell is previously in the 0 state and has a low voltage on node A relative to node B, the word line of the selected cell is pulled down to 0 volts. The NMOS transistor 14a remains on and node A follows, being pulled down to 0 volts. With the NMOS transistor 14a on, there is a high capacitive coupling between the gate of the NMOS transistor 14a and its drain, channel, and source. Thus, node B is coupled down from 2V/3 to close to V/3 when the word line voltage goes down.

To write 0, the bitline bar 18a is brought up to V, while the bitline 18 remains at 2V/3. The OTS device 12a now has 2V/3 applied across it and remains off. The OTS device 12b has 2V/3 applied across it and it also remains off. Thus, neither OTS device 12 turns on.

Next, the bitline bar 18a is brought back to 2V/3. With NMOS transistor 12a on, there is high capacitive coupling between the gate of the NMOS transistor 14a and its drain, channel, and source. Thus, node B remains at a value close to V/3, the voltage it was at before the bitline bar 18a was raised to V. Then, the word line 16 is brought back up to V/3. Again, with the NMOS transistor 14a on, there is a high capacitive coupling between the gate of the NMOS transistor 14a and its drain, channel, and source. Thus, node B couples up to 2V/3, keeping the NMOS transistor 14a on and node A is also brought up to V/3, following the word line potential.

For the case where the cell is previously in the one state, writing a 1 or a 0 is symmetrically analogous to the procedure described above.

A worse case write condition may exist where the on voltage for an unselected bit may be increased by writing another bit repeatedly on the same column. In this case, a bit is repeatedly written on the same column to the same state on the bitline. For this repeating write cycle, a bitline is repeatedly pulled to V from 2V/3 for write and then back up to 2V/3 after write. For example, a bitline spending half of the time at V, compared to 2V/3, will be at an average voltage of 2.5V/3, the voltage seen by other bits on the column that are not written. Since this is the effective pull-up voltage on the column through which the OTS device charges node A (or node B if it is bitline bar that is not actively driven low by an on transistor. Thus, the OTS device 12 pulls the "off" node up to the average voltage on the bit line, and internal node A on the unwritten bits is pulled to 2.5V/3 because the internal node impedance is greater than the time of a write cycle.

After the column is "hammered" so long that the internal node is as high as it can go on the unwritten bits, the opposite state is written to a cell that is on the hammered column, but was not the cell selected during the hammering. Here, the drive on the on transistor 14b is greater due to the higher gate voltage, so that more current is forced into node B through the bitline bar when bitline bar is the bit line pulled to V. To minimize the increase in worse case current necessary through the OTS device 12, the duty cycle may be minimized and, preferably, does not exceed a given percentage, such as 50 percent. Otherwise, V may be increased or the maximum threshold voltage reduced so that the ratio of the on voltage (the voltage on node A minus the threshold voltage minus the word line voltage) for its maximum value versus its minimum value during write is reduced to assure that excessive current is not required through the OTS device to overcome the on resistance. Similarly, the minimum on voltage may be chosen by increasing V and/or reducing threshold voltage so that when the word line is pulled to ground, the transistor is on hard enough so that the on transistor keeps the node reasonably near the word line voltage to avoid the possibility of flipping the bit if there is a mismatch between the internal nodes A or B of a given bit.

Also, $V_H$ and V may be adjusted so that the minimum on voltage (Vonmin) is maintained and adequate even if there is significant parasitic capacitance on node A or feedthrough capacitance from the OTS device. That is, to increase Vonmin, $V_H$ may be reduced and/or V increased to minimize drain-source "on" voltage for the "on" transistor, when the word line is lowered so that the opposite transistor in the cell does not tend to come on and "flip" the bit—causing a bit disturb condition.

For cases with less margin, where a bit may have just been written and the node B (driven by the off transistor) is not yet high enough when the word line is deselected to V/3, read or write disturb may be avoided. To minimize the source to drain voltage for the on transistor during the transition of the word line from V/3 to 0, the word line may be driven with a controlled, relatively slow edge rate initially, such as with a current source, for at least 50% or more of the transition so the transistor is turned on with more Von before driving the word line at a faster dV/dt rate to ground.

A detailed example of a read operation is now provided without limiting the scope of the present invention. Initially, such as in standby or deselect or precharge, all word lines are biased at V/3. All bitlines and bitline bars are biased at 2V/3. Consider the case where the cell is previously in the 0 state. For this case, the NMOS transistor 12a is turned on with negligible drain to source voltage drop. Thus, the node A is at a potential of V/3. Transistor 12b is turned off. The off state resistance of the NMOS transistor 12b is preferably much higher than that of the OTS device, so that most of the bias voltage between bit line and word line is dropped across the off transistor instead of the off OTS device 12. Thus, node B is at a potential close to 2V/3 before the word line potential is lowered.

To initiate the read cycle, the word line of the selected cell is pulled lower than the deselect voltage, such as from V/3 to 0V. NMOS transistor 12a remains on and node A follows, being pulled down to 0V because node A is actively driven by an on transistor 12a. With NMOS transistor 12a being on, there is high capacitive coupling between the gate of NMOS transistor 12a and its drain, channel, and source. Thus, node B is coupled down from about 2V/3 to close to V/3 when the word line is lowered because the transistor feed-through capacitance from gate to the source/drain is most of the capacitance on node B.

During the pulldown on the word line, the bitlines were pre-charged and equalized at 2V/3. Next the pre-charge is released, and a current source may be applied to both the bitline and bitline bar, causing the selected bitline and bitline bar voltages to rise at a linear rate until the OTS device, driven by the on transistor 12a, triggers on, thus dis-charging the bitline and its array capacitance on one of the columns being read, such as bitline 18 if transistor 14a was on and node A lower than node B at the start of the read cycle. Since node A is at 0V and actively driven there, while node B is at V/3 and basically floating, OTS device 12a turns on first. This pulls down the bitline voltage to V (word line)+$V_H$ (OTS), or about 0V plus $V_H$, or between V/3 and 2V/3. Bitline bar will charge towards V and above, but may be clamped before it reaches V to assure bitline bar remains less than V. If $V_H$ is close to 2/3V, then the bitline clamps at or below 2V/3. If $V_H$ is close to V/3, then the bitline clamps at V/3. Bitline bar still charges towards V regardless of the voltage on node A, so long as the difference between node A and word line 16 remains less than $V_{TH}$.

The transient current through 14a increases the source-drain voltage drop of on transistor 14a. If this voltage exceeds $V_{TH}$, then transistor 14b turns on (instead of remaining off as desired). To better avoid that condition, the capacitance on bitline 18 may be minimized for improved margin. For example, the capacitance on bitline 18 may be less than the capacitance on node A so the capacitive divider does not force a source-drain voltage across transistor 14a that exceeds the threshold voltage of the transistor 14b. Or the on resistance of device 12a may be increases to be greater than the worst case Ron(14a) to better assure the transient source-drain on voltage does not exceed the threshold voltage of the transistor 14b.

Since $V_H$ is less than 2V/3, a sense amplifier can sense the differential between bitline and bitline bar and amplify the result representing the data stored in the cell because bitline may be rapidly driven down to less than 2V/3 when OTS 12a turns on, whereas the off-side bitline bar rises above 2V/3 even if OTS 12b comes on since transistor 12b is off. OTS 12b may come on, for example, if the threshold voltage of the OTS is closer to 2V/3 instead of V, and if the gate voltage is less than V/3 (though node B needs to stay greater than Vth (transistor 12b)+Von, to avoid transistor 12a turning off). However, even with OTS 12b triggering on and then pulling node B to within $V_H$ of the bitline bar voltage (since presumably the column capacitance is much greater than node B capacitance), the bitline bar can continue to charge up since transistor 14b is off, so node B and its capacitance and load can be driven high rapidly, thus, increasing the turn-on to Von above threshold voltage (Vgate-source) for transistor 14a.

After latching the difference on the bitline and bitline bar columns, the bitline and bitline bar current sources may be turned off. The word line may be raised to V/3 while the bit lines are forced to 2V/3. This turns off OTS 12a by assuring V/3 or less is across the OTS 12a, since node A is actively driven to remain equal the word line. The state of the cross-coupled NMOS transistors 14 is undisturbed and the read operation is non-destructive.

With NMOS transistor 12a being on, there is high capacitive coupling between the gate of NMOS transistor 12a and its drain, channel, and source. Thus, node B remains at or above V/3 above the word line before and after the word line is lowered to 0 and raised back to V/3. The RC (through the R of the untriggered (OFF) OTS into the gate capacitance (node B) of the on transistor) may be high enough so that the internal node B is only gradually driven through the OFF OTS to be different from the capacitively coupled voltages on the gate of the on transistor (drain of the off transistor).

Thus, because of this capacitive coupling, node B couples up to a voltage above V/3, and preferably above V/3 plus the threshold voltage of transistor 14a, when the word line is raised from 0V to 1/3V. If OTS 12b came on during the read cycle (because the $V_H$ is closer to V/3), the node B could be at 2V/3 or greater before the word line is raised from 0 to V/3. Then, when word line is raised from 0 to V/3, the node B could couple from 2V/3 to V or higher. Still, this assures that more than V/3 remains across the gate to source of the on transistor 12a. This keeps NMOS transistor 12a on and node A is also brought up to V/3, following the word line potential as the word line is raised from 0V back to V/3.

If $V_H$ is much less than 2V/3 (by being closer to V/3), the "on" column during read can be less than 2V/3 for a significant percentage of time when the word line is at 0V—depending on duty cycle. This may degrade the average Von voltage for other deselected bits in standby on that column. This is because the word line for other deselected bits remains at V/3, but the column bitline or bitline bar voltage for the bit being read can be less than 2V/3, the column bitline voltage connected to other deselected bits.

A repeating read may be run on a selected bit or bits in the selected column where the selected column is repeatedly read with the same bitline being the low or "ON" side. If the duty cycle is 50% or greater, the selected column averages V/2 or even less in voltage, depending on $V_H$. Accordingly, assuring a low duty cycle, preferably less than 25%, minimizes the degradation in Von for deselected bits in some embodiments. Making $V_H$ at or near the minimum threshold voltage of the OTS devices so that $V_H$ is preferably closer to 2V/3 instead of V/3, also minimizes degradation in Von for bits in standby during repeated reads.

Alternatively, the selected column bit lines may be pre-charged and equalized to V before the word line is selected. Then, by pulling the word line down with a current source with a controlled slope (dV/dT), the OTS in the selected cell that is connected to the lowest drain voltage turns on first because more voltage is across the OTS. The transistor 12a turns on the OTS 12a driven by transistor 12a, and then drives the bitline low while the other bitline remains relatively high, since it is charged low only by leakage. This approach keeps the lower bitline mostly above 2V/3 and avoids degrading the high node in standby cells.

Other alternatives that improve performance and margin will be apparent to those reasonably skilled in the art. For example, if the bit lines are equalized and charged high or low, the rate of change in the column may be sensed. When the rate of charging changes, one of the OTS device 12 has turned. Accordingly, the read currents charging the two selected bitlines 18 and 18a may both be turned off, the voltage levels compared to determine cell state from which is higher, and the levels pre-charged back to the deselect level. This approach may minimize delay and minimize any changes for average deselect bit levels during read.

Similarly, during write, the current into the column selected may be sensed as the column is driven from 2V/3 to V. If the current does not increase after a brief period (e.g., 10 nsec) or if it increases and then decreases, the write cycle may be terminated. This similarly minimizes the write cycle time and decreases the time the bit lines are at other than the deselect voltage. To ease the write current, the Ron of the transistors 14 may be increased (by adjusting the width or length of transistors 14). If Ron (transistor) is less then Rdyn (OTS 12), the cell will write more readily at less current. Similarly, if Rdyn (OTS 12) is low so the drop at peak write current is low, the voltage margin may improve.

Figure 1A:
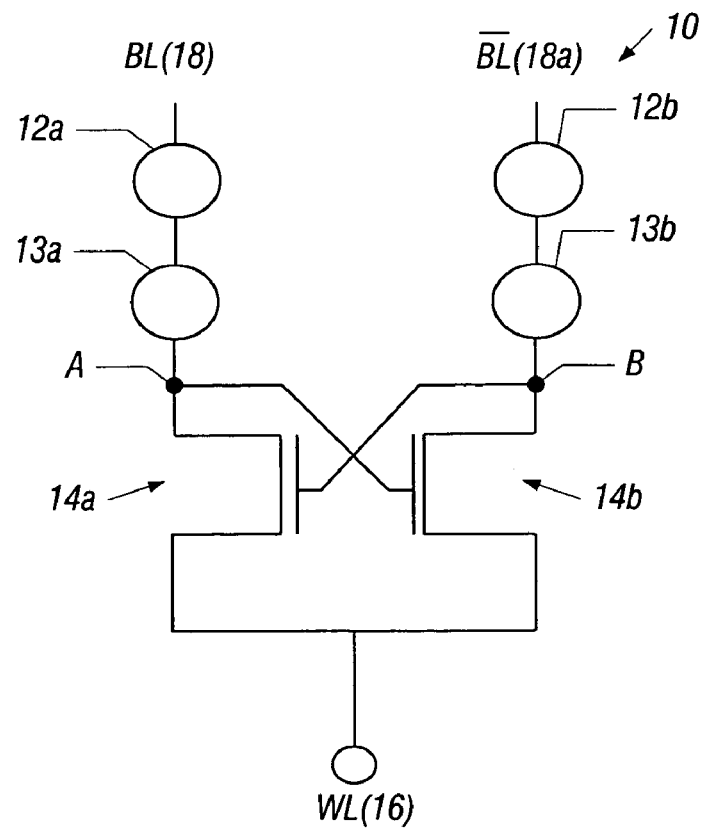

As a further non-volatile alternative, the 12 may be composed of OTS devices 12a, 12b and phase change memory cells (OUM) 13a, 13b as indicated in FIG. 1A. For example, an OUM device 13 may be in series with each OTS device 12. The OUM may be formed of $Ge_2Se_2Te_5$, in one embodiment. Then, the OUM may be written to a low or high resistance techniques using the techniques described herein. Further, the resistance may be decreased by terminating the write cycle with a slow trailing edge (such as slowly restoring the bit line and/or word line to the deselect level, such as with an edge rate greater than 500 nsec). Similarly, the resistance may be increased by terminating the write cycle with a fast trailing edge (such as by restoring the bit line and/or word line to the deselect level with a fast edge rate, such as faster than 10 nsec).

Where an OUM is used alone, the use of fast edge rates maintain the OUM in a relatively high resistance state. Similarly, where an OUM is used in series with an OTS, the OUM may simply add to the resistance of the OTS by terminating cycles with a slow edge rate. However, writing the OUM 13a, 13b associated with both OTS devices 12a and 12b to the appropriate state so the state is retained on power off, each may be successively "written"—one with a slow terminating edge rate and the other with a fast terminating edge rate.

For high performance operation, the OUM portion of device 12 may be maintained in the low or lower resistance state during normal operation and written on power-down, so the cell state is retained on power up. Alternatively, the OUM may be maintained in the high resistance (threshold state) during normal operation (through use of fast edge rates during read and write), and then one side of the cell written to low resistance state on power down.

Figure 4:
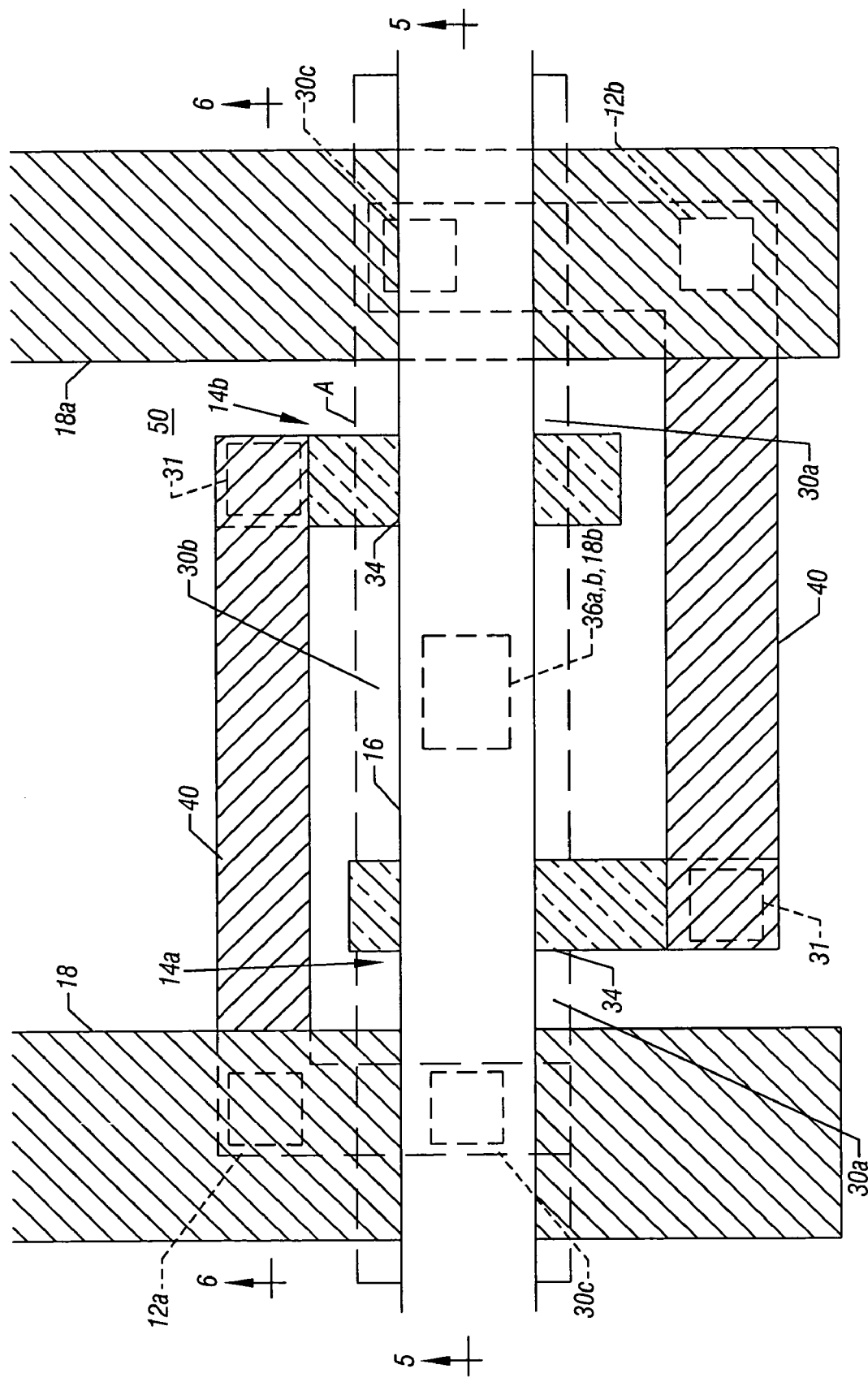
FIG. 4 is a partial, top plan view of a cell layout in accordance with one embodiment of the present invention.
Figures 5, 6:
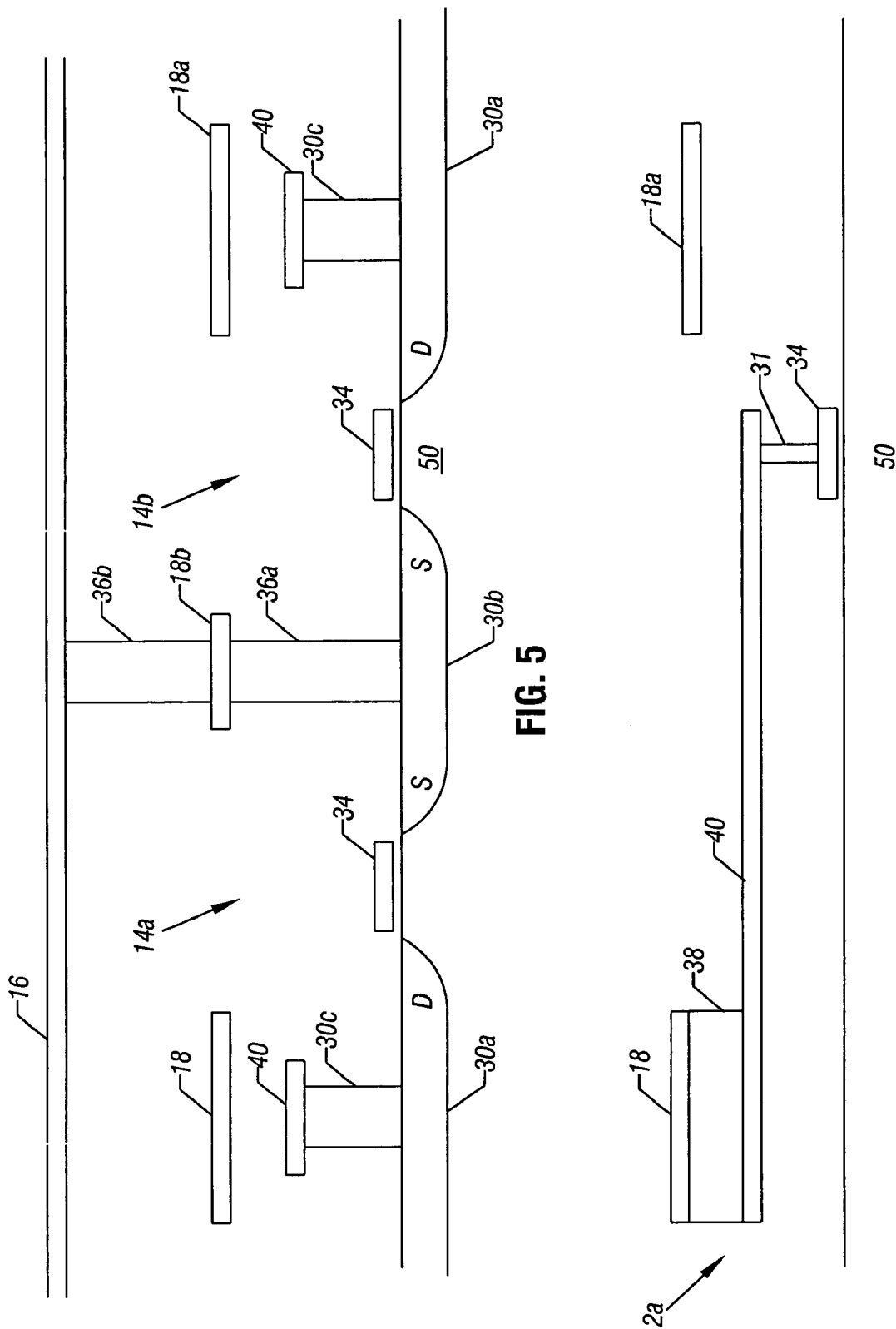
FIG. 5 is a cross-sectional view taken generally along the line 5-5 in FIG. 4 in accordance with one embodiment of the present invention.
FIG. 6 is a cross-sectional view taken generally along the line 6-6 in FIG. 4 in accordance with one embodiment of the present invention.

FIGS. 4-6 show an example of a layout for the OTS SRAM cell 10. The two NMOS transistors 14a and 14b are cross-coupled using the OTS lower electrode L-shaped conductor 40. For the OTS devices 12a and 12b, their top terminal electrodes are integral with bitlines 18 or bitline bars 18a respectively. The word line 16 spans from left to right, making contact in the middle of the active area A between the cross-coupled transistors 14a and 14b.

In this example, metal 2 is used for the word lines 16 and metal 1 is used for the bitlines and bitline bars 18, 18a. The OTS lower electrode, L-shaped conductor 40 is located below the metal 1 level. The contact down to active area A from the word line 16 may be done using an intermediate plug 36b from metal 2, forming the word line 16, down to metal 1 contact 18b. Then another plug 36a may extend from the metal 1 contact 18b down to the active area A to contact the common source 30b of the transistors 14a and 14b. Thus, looking at FIG. 4, the topmost level is the level metal 2, which forms the word line 16. Below metal 2 are plugs 36a used to contact from metal 2 down to metal 1. Under the contact plugs 36a is the metal 1 which forms the bitlines 18 and the bitline bars 18a. A contact plug 18b under metal 1 contacts the silicon active area A.

The drain 30a of each transistor 14a, 14b is coupled by plug 30c to the L-shaped conductor 40, which also forms the lower conductor of an OTS 12a or 12b, and also cross-couples the respective transistor drain 30a to the other transistor's gate 34 as further indicated in FIG. 6. Thus, the OTS 12a or 12b includes an upper conductor, in common with the bitline 18 or bitline bar 18a, the chalcogenide 38, and the conductor 40, that also forms the interconnection for cross-coupling the drains 30a of each transistor to the other transistor's gate. Thus, the cross coupling of the gates 34 to the drains 30a may be achieved by the L-shaped conductor 40 and the plug 31 that extends downwardly to contact a gate 34 on one end and couples an OTS 12 on the other end by forming the OTS's lower electrode. The gates 34 may be polysilicon in one embodiment. The areas between conductive lines are insulating or dielectric layers (not shown).

With very low temperature processing after depositing the chalcogenide 38, alloy 1938 may be used as the chalcogenide 38. For higher temperature processing after chalcogenide deposition and for applications allowing higher leakage levels and standby current, "stag" alloy 1040 may be used as the chalcogenide 38. TiSiN or TiAlN may be used between aluminum or copper interconnect layers, for example, for the conductor 40. Tungsten (W) or Aluminum (Al) may be used for the bitline 18. The plugs 30, 39, 36a, and 36b may be formed of tungsten in one embodiment.

The SRAM cell 10 may be embedded in combination with a non-volatile memory cell. For example, in non-volatile memory in the form of a phase change memory with an OTS select device, the OTS devices may be fabricated to act as select device for the phase change memory and also serve as part of SRAMs cells as outlined herein. This allows the addition of a compact more efficient SRAM memory cell with less additional processing. Further, this approach can beneficially add a low cost cache buffer to the non-volatile Flash that uses a phase change memory. The SRAM cell can be placed underneath a phase change memory array since the phase change memory array does not need an active isolation device within or under the memory cell. The SRAM cell 10 may be written by the non-volatile cell (such as at power-up or upon command by the external user through an input/output interface). Similarly, the SRAM cell 10 may be loaded into the non-volatile memory upon powering down.

In some embodiments, OTS SRAM cells may be much smaller than 4T or 6T SRAM cells. Size reduction reduces the cost of the SRAM memory, whether as applied to stand alone commodity memory or as embedded memory on a chip that provides other functionality, such as a microprocessor or digital signal processor. It also provides for potential increased memory capacity while keeping chip size within reasonable limits as dictated by package size and die yield constraints.

In comparison with 4T SRAM cells, the vertical height of the cell can be reduced due to the relatively short height of the OTS device as compared to vertical intrinsic resistors, which have to be tall enough to avoid voltage breakdown at max supply voltage. The area of the cell can be reduced since the area of the pass gates connected to the word line may be eliminated as well as the connection to ground (saving one metal line or layer).

Figure 7:
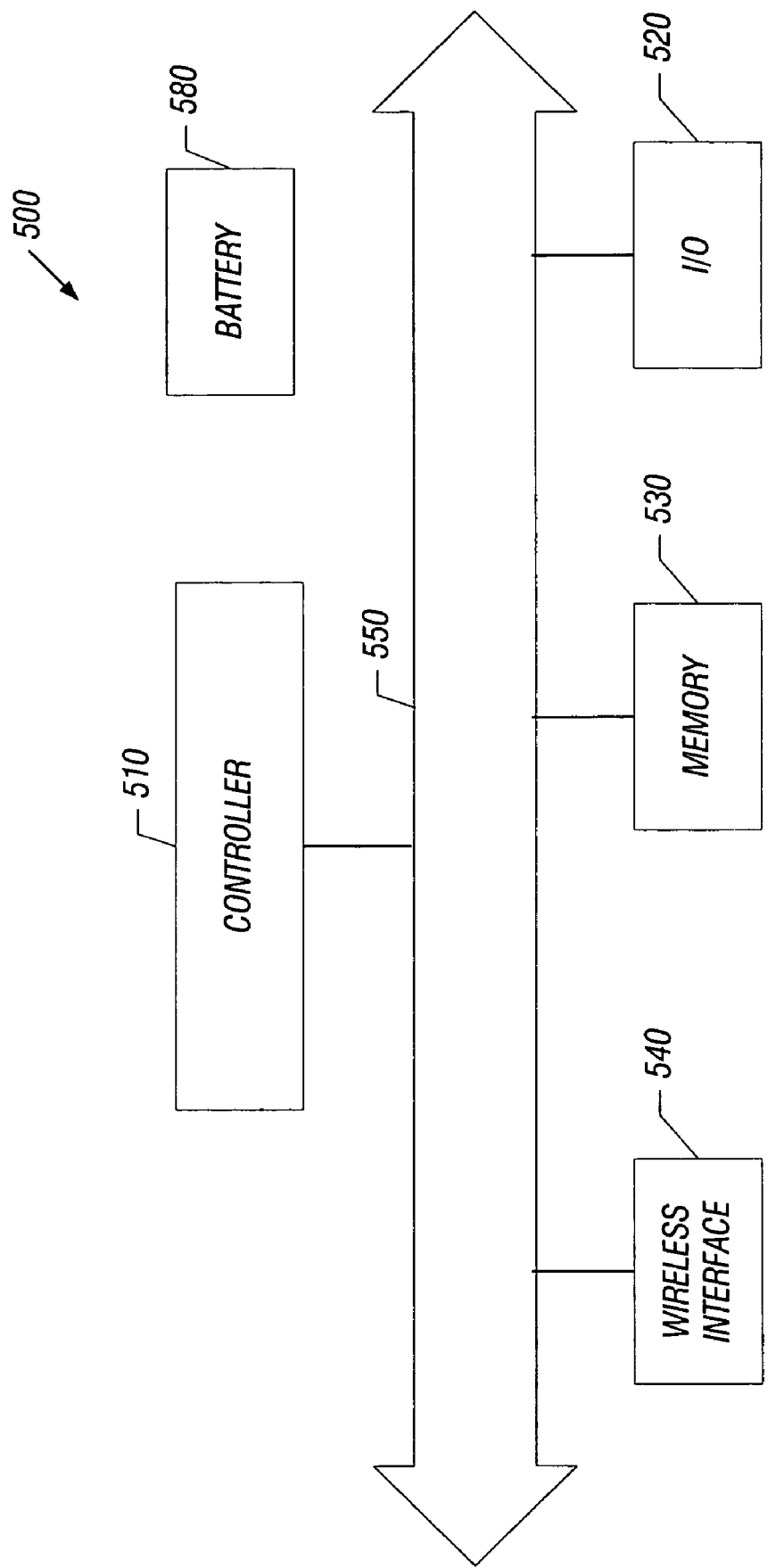
FIG. 7 is a schematic depiction of a system in accordance with one embodiment of the present invention.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540, coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, a phase change memory, and/or the static random access memory 10 illustrated in FIG. 1. The static random access memory described herein may communicate with the other elements of system 500 or with the external user through the I/O bus or otherwise (such as wireless) by techniques that are familiar to those reasonably skilled in the art.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A static random access memory comprising:
 a static random access memory cell including a chalcogenide that is always in an amorphous phase and cross coupled NMOS transistors, wherein the gate of each transistor is coupled to the drain of the other transistor, said memory cell including first and second ovonic threshold switches, said chalcogenide being part of said switches.

2. The memory of claim 1 including an ovonic threshold switch including said chalcogenide.

3. The memory of claim 2 including a phase change memory in series with said switch.

4. The memory of claim 1 wherein said transistors have a common source.

5. The memory of claim 1 wherein one transistor's gate is coupled to said first ovonic threshold switch and the other transistor's drain is coupled to said first ovonic threshold switch.

6. The memory of claim 5 including an L-shaped metal layer having opposed ends, said layer coupled to one said NMOS transistor drain on one end, a region between the ends forming the lower conductor of said first ovonic threshold switch and said layer coupled to a gate electrode of the other said NMOS transistors on the other end.

7. The memory of claim 6 including a plug from said layer to said gate electrode.

8. The memory of claim 6 including a bitline coupled to said first ovonic threshold switch and a bitline bar coupled to said second ovonic threshold switch.

9. A method comprising:
 forming a static random access memory using a chalcogenide that is always in the amorphous phase;
 forming said static random access memory using cross coupled NMOS transistors;
 coupling the gate of each transistor to the drain of the other transistor; and
 forming a first and second ovonic threshold switch and coupling the gate of one transistor to said first ovonic threshold switch and the drain of the other transistor to said first ovonic threshold switch.

10. The method of claim 9 including forming an ovonic threshold switch using said chalcogenide.

11. The method of claim 10 including forming a phase change memory in series with said ovonic threshold switch.

12. The method of claim 11 wherein a phase change memory state is determined by a trailing edge of a read or write termination cycle.

13. The method of claim 9 including forming a common source for said NMOS transistors.

14. The method of claim 9 including forming an L-shaped metal layer having opposed ends such that one end of said layer is coupled to one said NMOS transistor drain, a region between the ends forms a lower electrode of said first ovonic threshold switch and the other end of said layer is coupled to the gate electrode of the other said NMOS transistors.

15. The method of claim 14 including forming a plug from said layer to said gate electrode.

16. The method of claim 14 including coupling said first ovonic threshold switch to a first bitline and said second ovonic threshold switch to a second bitline.

17. The method of claim 9 including reading said memory by charging a pair of bitlines and then discharging one of the bitlines relative to the other.

18. The method of claim 9 including writing said memory by biasing one of said bitlines coupled to said cell higher than the other of said bitlines.

* * * * *